(12) United States Patent
Blackmon et al.

(10) Patent No.: US 8,397,100 B2
(45) Date of Patent: Mar. 12, 2013

(54) MANAGING MEMORY REFRESHES

(75) Inventors: H. Lee Blackmon, Moline, IL (US); Ronald E. Freking, Rochester, MN (US); Ryan S. Haraden, Rochester, MN (US); Joseph A. Kirscht, Rochester, MN (US); Elizabeth A. McGlone, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 357 days.

(21) Appl. No.: 12/723,743

(22) Filed: Mar. 15, 2010

(65) Prior Publication Data

US 2011/0225465 A1 Sep. 15, 2011

(51) Int. Cl.
G06F 11/07 (2006.01)

(52) U.S. Cl. ......... 714/6.1; 714/47.2; 711/106; 711/167

(58) Field of Classification Search .................... 714/6.1, 714/47.2
See application file for complete search history.

(56) References Cited

U.S. PATENT DOCUMENTS

| 2007/0211549 A1* | 9/2007 | Kobayashi .................... 365/222 |
| 2008/0002590 A1* | 1/2008 | Thomas et al. ............... 370/242 |
| 2008/0270870 A1 | 10/2008 | Kirscht et al. |
| 2010/0005366 A1 | 1/2010 | Dell et al. |

FOREIGN PATENT DOCUMENTS

EP 0320809 A2 6/1989

OTHER PUBLICATIONS

"Double Data Rate (DDR) SDRAM", JEDEC Standard, Feb. 2008, pp. 1-84, JEDEC Solid State Technology Association.*

Micron Technology, "Double Data Rate (DDR) SDRAM", 2003, Figures 45-48.*

Bhalodia, Vimal, "SCALE DRAM Subsystem Power Analysis", Sep. 2005, Massachusettes Institute of Technology, pp. 1-51.*

Micron Technology et al., "Double Data Rate (DDR) SDRAM", Internet Citation, 2000 url: http://download.micron.com/pdf/datasheets/dram/ddr/512MBDDRx4x8x16.pdf [retrieved on Apr. 19, 2006] figures 45-48.

International Search Report and Written Opinion of the International Searching Authority, European Patent Office, International Application No. PCT/EP2011/052630, May 9, 2011 (14 pgs).

"Double Data Rate (DDR) SDRAM", JEDEC Standard, Feb. 2008, pp. 1-80, Arlington, VA, USA p. 7, left-hand column, paragraph 5, p. 7, right-hand column, paragraph 4, figures 7, 45-48; tables 2, 11, p. 20, left-hand column, paragraph 4, p. 20, right-hand column, last line, p. 43, right-hand column, paragraph 1-3.

* cited by examiner

*Primary Examiner* — Chae Ko
(74) *Attorney, Agent, or Firm* — Toler Law Group

(57) ABSTRACT

Systems and methods to manage memory refreshes at a memory controller are disclosed. A method includes determining, at a memory controller device, that a number of transmission errors between a memory controller port and a memory redrive device exceeds an error threshold. The method may include initiating a first link retraining process between the memory controller port and the memory redrive device. The method may further include placing one or more dynamic random access memory modules associated with the memory redrive device in a self-refresh mode. The method may also include removing the one or more dynamic random access memory modules from the self-refresh mode after the link retraining process has completed. The method may further include enabling overlapping refreshes of the one or more dynamic random access memory modules.

20 Claims, 5 Drawing Sheets

MANAGING MEMORY REFRESHES

I. FIELD OF THE DISCLOSURE

The present disclosure relates generally to refreshing memory, and more specifically, to managing memory refreshes.

II. BACKGROUND

Dynamic random access memory (DRAM) may have more than one internal memory bank. The DRAM is normally refreshed responsive to a refresh command that is periodically issued to the DRAM by a memory controller. When the DRAM receives a refresh command, the internal memory banks wait for a time period to complete a ReFresh Cycle (tRFC) before any of the internal memory banks can be accessed by a read or a write operation. As the capacity of DRAM increases, the tRFC may also increase. For example a 1 Gigabyte (Gb), a 2 Gb, a 4 Gb, and a 8 Gb double data rate (DDR) 3 DRAM may have a tRFC of 110 nanoseconds (ns), 160 ns, 300 ns, and 350 ns, respectively.

In a memory subsystem that supports multiple memory ranks, refresh commands between any two memory ranks are typically not overlapped. Overlapping the refresh commands increases the probability that an incoming read command will wait (for the overlapping refresh cycles to complete) before the read command can be sent to the DRAMs. To avoid overlapping refresh commands, an interval timer may be used to equally space refresh commands issued by the memory controller. Under some circumstances (e.g., during link retraining), the memory controller may place the DRAM in a self-refresh mode. During the self-refresh mode, the DRAM may not wait for refresh commands from the memory controller to initiate a refresh. The DDR DRAM specification states that a memory controller issue at least one refresh command after the DRAM exits from a first self-refresh mode and before the DRAM enters into a second self-refresh mode.

When a memory controller determines that a number of transmission errors occurring at a high-speed memory bus exceeds a predetermined threshold, the memory controller may initiate a link retraining process to resynchronize the high-speed memory bus to reduce the transmission errors. As part of the link retraining process, the DRAM may be placed in a self-refresh mode. After the link retraining process has completed, the DRAM may come out of the self-refresh mode. If the memory controller determines that the number of transmission errors occurring at the high-speed memory bus again exceeds the predetermined threshold, the memory controller cannot initiate a second link retraining. Initiating a second retraining would cause the DRAM to be placed into a second self-refresh mode. However, placing the DRAM in a second self-refresh mode may violate the DDR DRAM specification, because the memory controller may not have issued at least one refresh command to the DRAM after the DRAM exited from the self-refresh mode and before the DRAM entered into the second self-refresh mode.

III. SUMMARY OF THE DISCLOSURE

In a particular embodiment, a method of managing memory includes determining, at a memory controller device, that a number of transmission errors between a memory controller port and a memory redrive device exceeds an error threshold. The method also includes initiating a first link retraining process between the memory controller port and the memory redrive device. The method further includes placing one or more dynamic random access memory modules associated with the memory redrive device in a self-refresh mode. The method also includes removing the one or more dynamic random access memory modules from the self-refresh mode after the link retraining process has completed. The method further includes enabling overlapping refreshes of the one or more dynamic random access memory modules.

In another particular embodiment, a system includes one or more dynamic random access memory modules. The system also includes one or more memory redrive devices coupled to the one or more dynamic random access memory modules via one or more memory buses. The system also includes a memory controller device having one or more memory controller ports coupled to the one or more memory redrive devices via pairs of high speed buses. The memory controller device is capable of executing logic to determine that a number of transmission errors occurring at a particular pair of the high speed buses exceeds an error threshold. The memory controller device is capable of initiating a link retraining process between a memory controller port coupled to a memory redrive device via the particular pair of the high speed buses. The memory controller device is capable of placing in a self-refresh mode at least one dynamic random access memory module that is associated with the memory redrive device. The memory controller device is capable of removing the at least one dynamic random access memory module from the self-refresh mode after the link retraining process has completed. The memory controller device is capable of initiating at least one overlapping refresh of the one or more dynamic random access memory modules.

In another particular embodiment, a computer program product includes a computer usable medium having computer usable program code embodied therewith. The computer usable program code is executable by a processor to determine that a particular event has occurred at a computer. The computer usable program code is also executable by the processor to enable overlapping refreshes of one or more dynamic random access memory modules in response to determining that the particular event has occurred at the computer. The computer usable program code is further executable by the processor to initiate at least one overlapping refresh of the one or more dynamic random access memory modules. The computer usable program code is also executable by the processor to disable overlapping refreshes of the one or more dynamic random access memory modules after the at least two overlapping refreshes of the one or more dynamic random access memory modules has completed.

These and other advantages and features that characterize embodiments of the invention are set forth in the claims annexed hereto and forming a further part hereof. However, for a better understanding of the invention, and of the advantages and objectives attained through its use, reference should be made to the drawings and to the accompanying descriptive matter in which there are described exemplary embodiments of the invention.

IV. BRIEF DESCRIPTION OF THE DRAWINGS

V. DETAILED DESCRIPTION

Embodiments of the present invention may improve memory management by dynamically allowing memory refreshes of different ranks to overlap in a manner that may reduce latency and increase overall efficiency. In one example, a memory controller device may detect transmission errors, such as cyclic redundancy check (CRC) errors, occurring at a high speed bus that couples a memory redrive device to a memory controller port of the memory controller device. The high speed bus may be one of a serial management interface (SMI) bus, a fully buffered dual inline memory module (FB-DIMM) bus, and a fully buffered dual inline memory module 2 (FBD2) bus.

When a number of transmission errors between the memory controller port and the memory redrive device exceeds an error threshold, the memory controller device may initiate a first link retraining process between the memory controller port and the memory redrive device. The number of transmission errors may include a first number of transmission errors associated with a current transfer between the memory controller port and the memory redrive device. The number of transmission errors may also include a second number of transmission errors associated with two previous transfers between the memory controller port and the memory redrive device.

Initiating the first link training process may include placing one or more DRAM modules associated with the memory redrive device into a self-refresh mode. The memory controller device may remove the one or more DRAM modules from the self-refresh mode after the link retraining process has completed. The memory controller device may enable and initiate overlapping refreshes of the one or more DRAM modules.

Upon completion of the overlapping refreshes, the memory controller device may disable overlapping refreshes for the one or more DRAM modules. The memory controller device may initiate a second link retraining process between the memory controller port and the memory redrive device.

Figure 1:
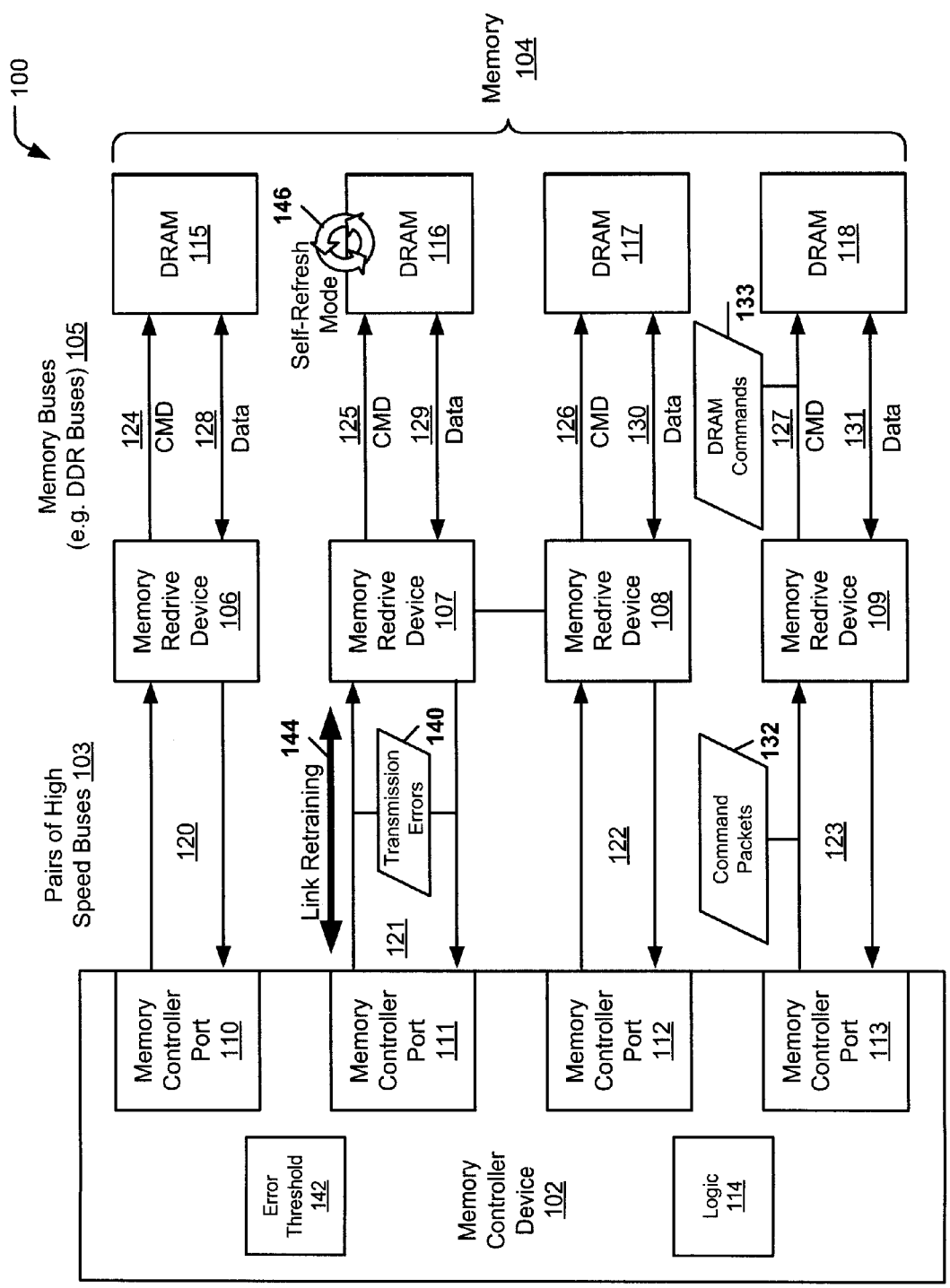
FIG. 1 is a block diagram of a first embodiment of a system to manage memory refreshes.

Turning particularly to the drawings, FIG. 1 is a block diagram of a first embodiment of a system to manage memory refreshes and is generally designated 100. The system 100 includes a memory controller device 102 coupled to a memory 104 via pairs of high speed buses 103. The system 100 further includes memory redrive devices 106, 107, 108, and 109, and memory buses 105.

The memory controller device 102 is configured to send commands to read and write data to and from the memory 104. The memory controller device 102 includes one or more memory controller ports, such as the representative memory controller ports 110-113. The memory controller device 102 may include logic 114 (e.g., operational instructions) that may be executable by the memory controller device 102 to perform various functions of the memory controller device 102.

The memory redrive devices 106-109 are coupled to the memory controller ports 110-113 via pairs of high speed buses 103 that include representative pairs of high speed buses 120-123. The high speed buses 120-123 may include: an SMI bus, an FB-DIMM bus, an FBD2 bus, another type of high-speed memory bus, or any combination thereof.

The pairs of the high speed buses 120-123 may experience transmission errors. In FIG. 1, transmission errors 140 are shown at the pair of high speed buses 121 between the memory controller port 111 and the memory redrive device 107. The transmission errors 140 may include CRC errors.

One or more of the memory redrive devices 106-109 may receive command packets from one or more of the memory controller ports 110-113. For example, the memory redrive device 109 may receive command packets 132 from the memory controller port 113. One or more of the memory redrive devices 106-109 may decode the received command packets and reformat the decoded command packets into DRAM commands, such as the representative DRAM commands 133.

One or more of the memory redrive devices 106-109 may send the DRAM commands to the memory 104 via one or more of the memory buses 105. The memory buses 105 may include command (CMD) buses 124, 125, 126 and 127 and data buses 128, 129, 130, and 131. In a particular embodiment, the memory buses 105 may be DDR buses. After sending DRAM commands to the memory 104, one or more of the memory redrive devices 106-109 may communicate a result of sending the DRAM commands back to the memory controller device 102 via one or more of the high speed buses 120-123.

The memory controller device 102 may store data at the memory 104 and retrieve stored data from the memory 104. The memory 104 may include DRAM, such as the representative DRAM 115, 116, 117, and 118. In a particular embodiment, each of the DRAMs 115-118 may be packaged as a Dual Inline Memory Module (DIMM). The DRAMs 115-118 may be DDR memory, DDR2 memory, DDR3 memory, DDR4 memory, Quad Date Rate (QDR) memory, another type of high-speed data rate memory, or any combination thereof.

In operation, the memory controller device 102 may execute the logic 114 to detect the transmission errors 140 occurring at one of more of the pairs of high speed buses 120-123. When the memory controller device 102 determines that a number of the transmission errors 140 exceeds an error threshold 142, the memory controller device 102 may initiate a link retraining 144 of the link (e.g., the pair of high speed buses 121) between the affected memory controller port (e.g., the memory control port 111) and affected memory redrive device (e.g., the memory redrive device 107).

The link retraining 144 may resynchronize the affected memory controller port 111 and the affected memory redrive device 107 via their associated pair of high speed buses 121 to reduce the transmission errors 140. As part of the link retraining 144, the DRAM associated with the affected memory redrive device may be placed into a self-refresh mode. For example, when the link retraining 144 is initiated between the memory controller port 111 and the memory redrive device 107, the DRAM 116 may be placed into a self-refresh mode 146.

When the link retraining 144 has completed, the memory controller device 102 may remove the associated DRAM (e.g., the DRAM 116) from the self-refresh mode (e.g., the self-refresh mode 146). When the associated DRAM (e.g., the DRAM 116) is no longer in self-refresh mode, the memory controller device 102 may enable overlapping refreshes of the DRAMs 115-118. Subsequently or concurrently, overlapping refreshes of the associated DRAM (e.g., the DRAM 116) may be initiated. The overlapping refreshes of the associated DRAM may be initiated by the memory controller device 102, one of the memory controller ports 110-113, one of the memory redrive devices 106-109, or any combination thereof. When the overlapping refreshes of the associated DRAM (e.g., the DRAM 116) has have completed, the memory controller device 102 may disable overlapping refreshes of the DRAMs 115-118. By performing overlapping refreshes of the DRAM 116 after the link retraining 144, the memory controller device 102 may be able to perform at least one refresh of the DRAM 116 after the DRAM 116 exits from a first self-refresh and before the DRAM 116 re-enters into a second self-refresh.

Thus, the memory controller device 102 may enable overlapping refreshes of the DRAMs 115-118, initiate overlapping refreshes of one or more of the DRAMs 115-118, and disable overlapping refreshes of the DRAMs 115-118 during different situations, such as after a link retraining of a particular pair of high speed buses (e.g. the pair of high speed buses 121). A second situation where the memory controller device 102 may initiate overlapping memory refreshes may occur during an initialization of a computer. For example, after the system 100 has been configured during the initialization, the memory controller device 102 may enable overlapping refreshes of the DRAMs 115-118, initiate overlapping refreshes of one or more of the DRAMs 115-118, and disable overlapping refreshes of the DRAMs 115-118. Performing overlapping refreshes during initialization may be useful when testing the system 100 because link retraining may be initiated after the initialization has completed without initiating a refresh of one or more of the DRAMs 115-118.

A third situation where the memory controller device 102 may initiate overlapping memory refreshes may occur when the memory controller device 102 receives a command destined for one of the DRAMs 115-118 that is in a low power mode. For example, to reduce power consumption of the DRAMs 115-118, the memory controller device 102 may place one or more of the DRAMs 115-118 in a low power mode (e.g., when one or more of the DRAMs 115-118 has not been accessed for more than a particular time period). The low power mode may be similar to the self-refresh mode 146 because the DRAM 116 may self-refresh without receiving refresh commands from the memory controller 102. When the memory controller device 102 receives a command and determines that the command is destined for one or more of the DRAMs 115-118 that is in the low power mode, the memory controller device 102 may remove one or more of the DRAMs 115-118 from the low power mode. The memory controller device 102 may initiate overlapping refreshes of one or more of the DRAMs 115-118. The memory controller device 102 may forward the received command to the destination DRAM after the overlapping refreshes of the one or more DRAMs 115-118 have completed.

Thus, the memory controller device 102 or the memory redrive devices 106-109 may initiate overlapping refreshes of one or more of the DRAMs 115-118 during different situations, such as after link retraining, during initialization, or after receiving a command destined for one or more of the DRAMs 115-118 that are in a low power mode. By doing so, the memory control device 102 may issue at least one refresh command to one or more of the DRAMs 115-118 after one or more of the DRAMs 115-118 exit from a self-refresh mode, thereby complying with the DDR specification.

Figure 2:
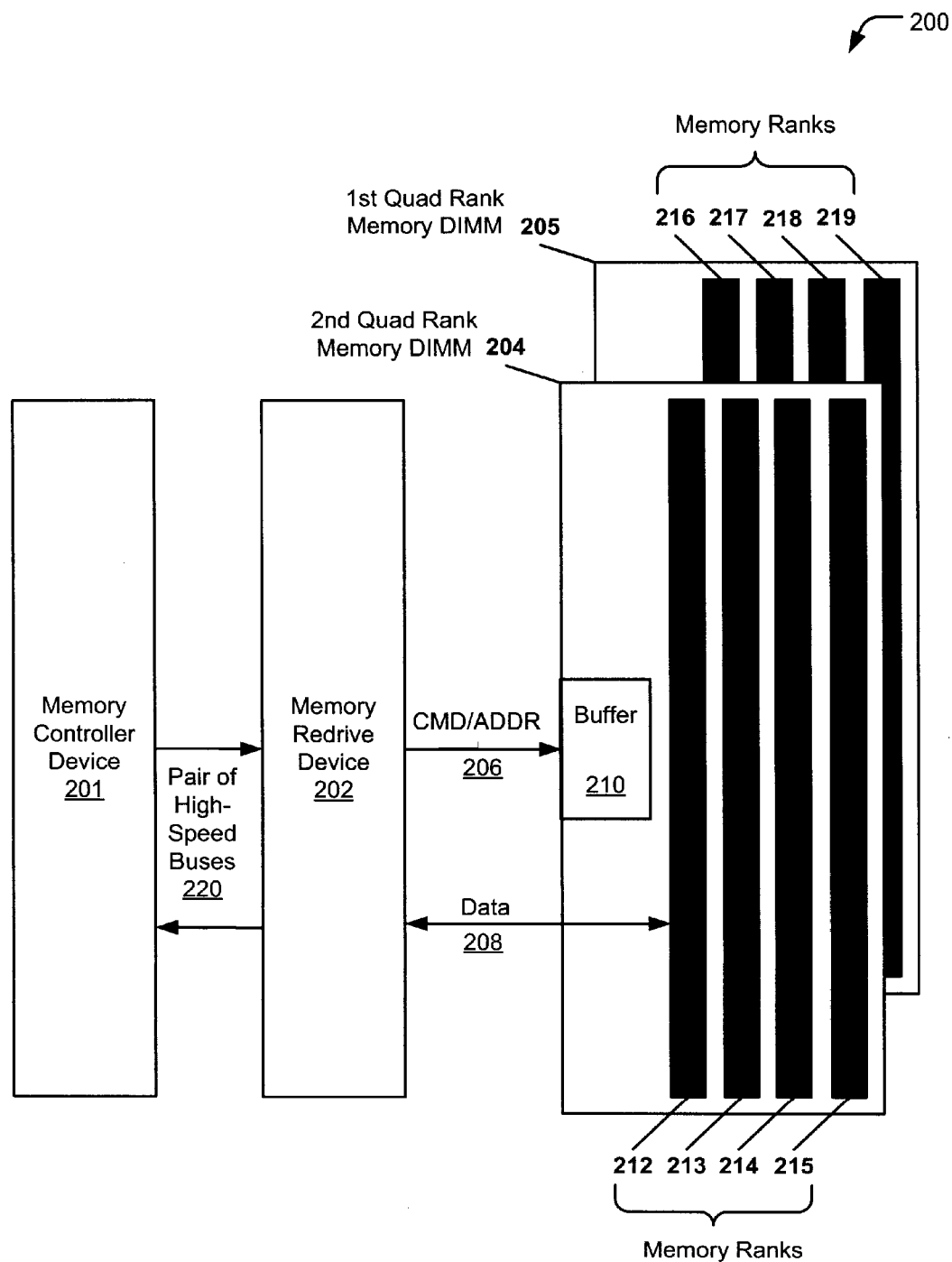
FIG. 2 is a block diagram of a second embodiment of a system to manage memory refreshes.

FIG. 2 is a block diagram of a second embodiment of a system to manage memory refreshes and is generally designated 200. The system 200 may illustrate details of the DRAMs 115-118 of FIG. 1. The system 200 includes a memory controller device 201 coupled to a memory redrive device 202 via a pair of high speed buses 220. A first quad rank DIMM 204 and a second quad rank DIMM 205 may be coupled to the memory redrive device 202 via a command/address (CMD/ADDR) bus 206 and a data bus 208. In a particular embodiment, the memory redrive device 202 may be one of the memory redrive devices 106-109 of FIG. 1.

The first quad rank DIMM 204 may include a buffer 210 and memory ranks 212, 213, 214, and 215. The second quad rank DIMM 205 may include memory ranks 216, 217, 218, and 219. Each of the memory ranks 212-219 may include multiple DRAM modules. Each DRAM module may supply 4, 8, 16, ... $2^n$ data bits, where n>1. Each DRAM module may be subdivided into eight internal banks. Each internal bank may be accessed, with up to four accesses in progress during a rolling "four active window."

An internal bank may not be accessed during a memory refresh command because the memory refresh command may refresh all banks within a particular rank. During runtime operation, overlapping of refreshes may not be desirable because overlapping refreshes may decrease the probability that an incoming command may be sent to the memory for execution with minimal latency.

The memory controller device 201 may initiate overlapping refreshes of the quad rank memory DIMMs 204 and 205 during different situations, such as after link retraining, during initialization, or after receiving a command destined for one or more of the quad rank memory DIMMs 204 and 205 that are in a low power mode. In this manner, the memory control device 201 may issue at least one refresh command to the quad rank memory DIMMs 204 and 205 after the quad rank memory DIMMs 204 and 205 exit from a self-refresh mode.

Figure 3:
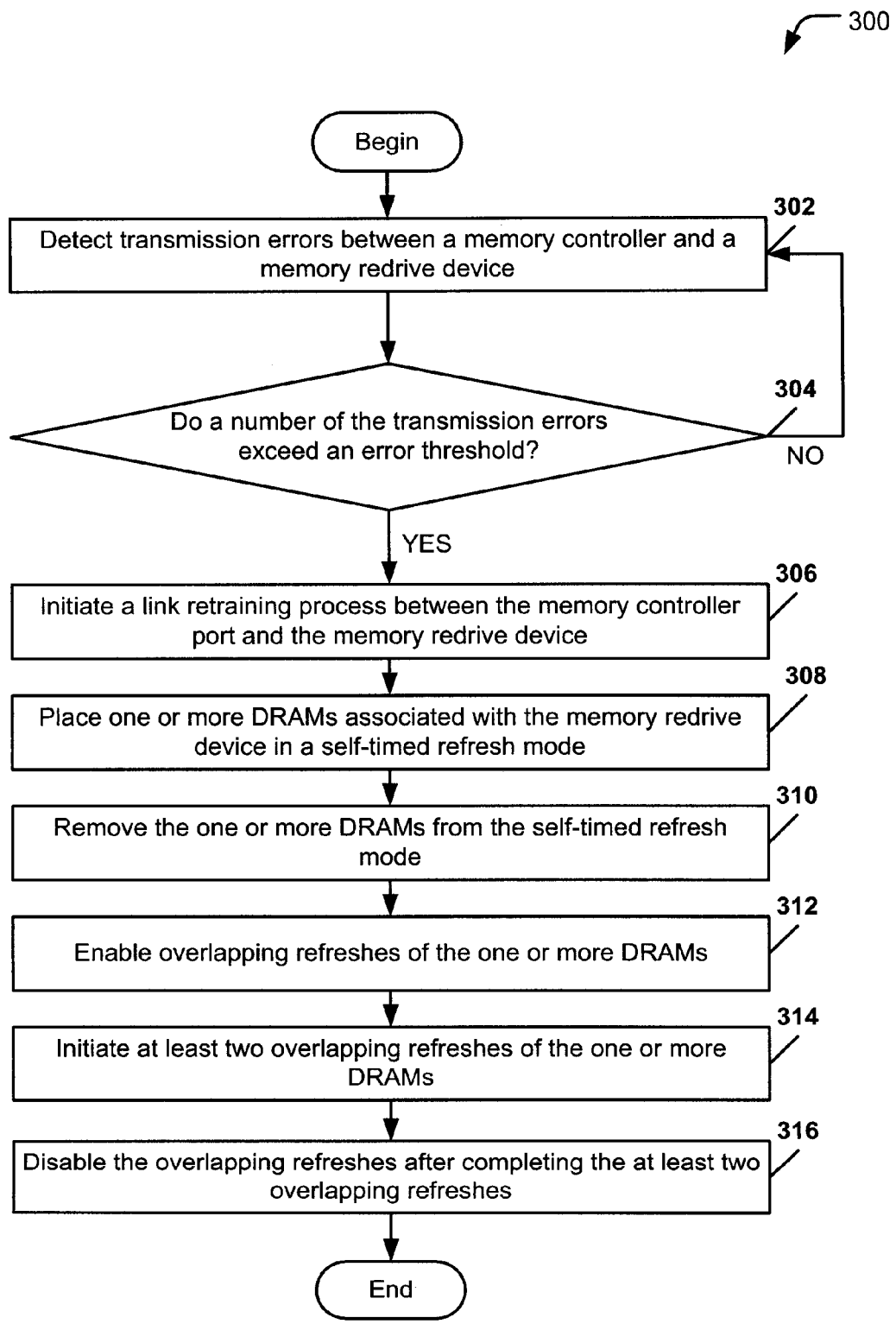
FIG. 3 is a flow diagram of a first embodiment of a method to manage memory refreshes.

FIG. 3 is a flow diagram of a first embodiment of a method to manage memory refreshes and is generally designated 300. The method 300 may be performed by a memory controller device, such as the memory controller device 102 of FIG. 1.

The method begins at 302, by detecting transmission errors in communications between a memory controller and a memory redrive device. For example, the memory controller 102 of FIG. 1 may detect the transmission errors 140 between the memory controller device 102 and the memory redrive device 107 of FIG. 1.

At 304, a determination may be made as to whether a number of the transmission errors exceeds an error threshold. The number of the transmission errors may include a first number of transmission errors associated with a current transfer between the memory controller port and the memory redrive device and include a second number of transmission errors associated with two previous transfers between the memory controller port and the memory redrive device. For example, the error threshold may be four transmission errors per second. To illustrate, in FIG. 1, the memory controller 102 may initiate the link retraining 144 when the number of transmission errors 140 are greater than four transmission errors per second. When the determination is "no," i.e., the number of the transmission errors does not exceed the error threshold, the method returns to 302. When the determination is "yes," i.e., the number of the transmission errors exceeds the error threshold, a link retraining process between the memory controller port and the memory redrive device is initiated, at 306. For example, in FIG. 1, when the memory controller device 102 determines that the number of the transmission errors 140 exceeds the error threshold 142, the memory controller device 102 may initiate the link retraining 144.

Advancing to 308, one or more DRAM modules associated with the memory redrive device may be placed in a self-refresh mode. For example, the memory controller 102 of FIG. 1 may place the DRAM 116 in the self-refresh mode 146 as part of the link retraining 144.

At 310, the one or more DRAM modules may be removed from the self-refresh mode. For example, in FIG. 1, the memory controller 102 may remove the DRAM 116 from the self-refresh mode 146 after the link retraining 144 has completed.

Continuing to 312, overlapping refreshes of the one or more DRAM modules may be enabled. At 314, at least two overlapping refreshes of the one or more DRAM modules may be initiated. For example, the memory controller device 102 of FIG. 1 may enable and initiate overlapping refreshes of the one or more DRAMs 115-118.

At 316, the overlapping refreshes of the DRAM modules may be disabled after completing the at least two overlapping refreshes. For instance, the memory controller device 102 of FIG. 1 may disable overlapping refreshes of the one or more DRAMs 115-118 after the at least two overlapping refreshes of the one or more DRAMs 115-118 has completed.

Thus, a memory controller device may initiate overlapping refreshes of DRAM after a link retraining process during which the DRAM was placed in a self-refresh mode. The memory control device may issue at least one refresh command to the DRAM after the DRAM exits from a self-refresh mode.

Figure 4:
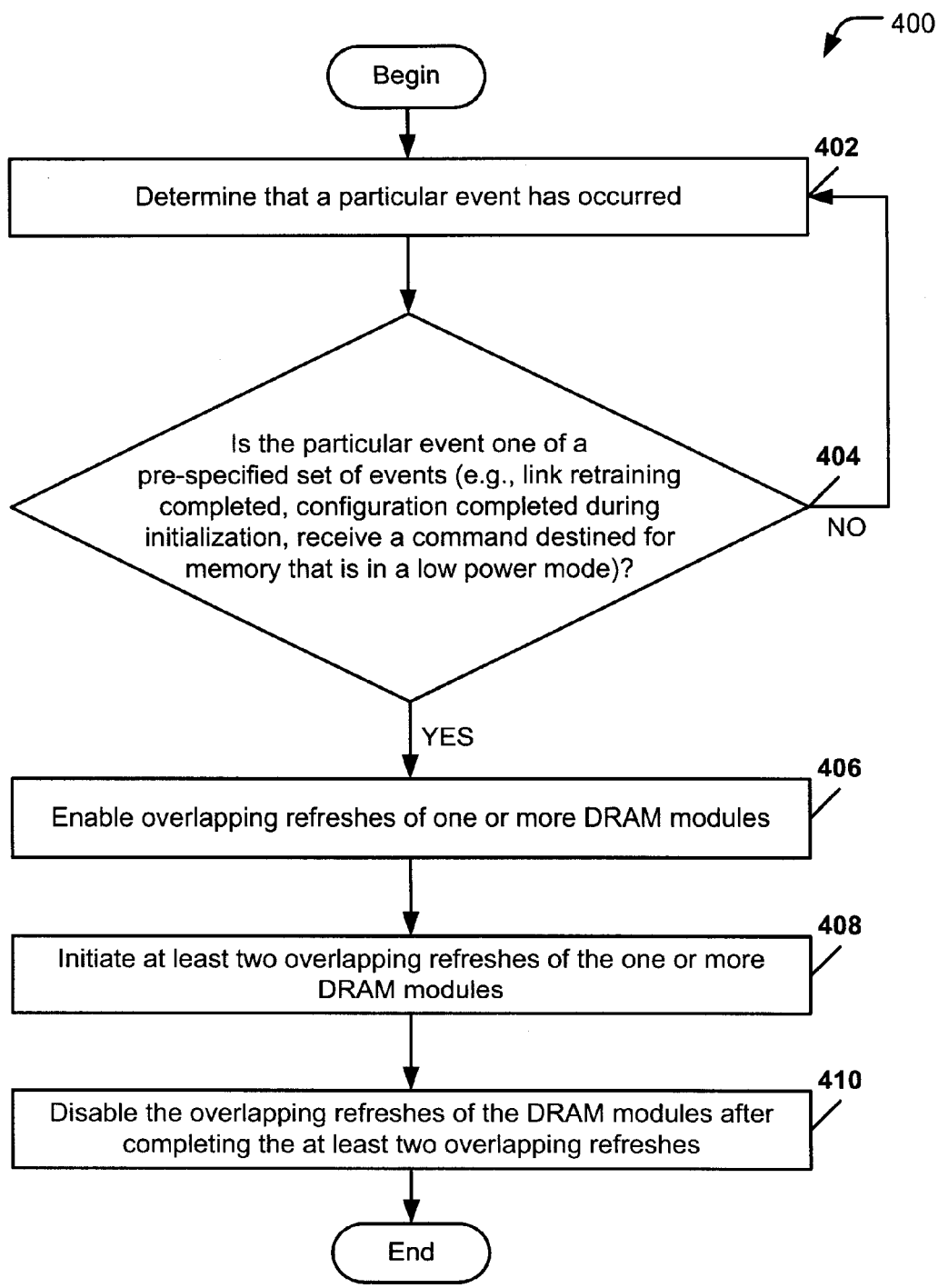
FIG. 4 is a flow diagram of a second embodiment of a method to manage memory refreshes.

FIG. 4 is a flow diagram of a second embodiment of a method to manage memory refreshes and is generally designated 400. The method 400 may be performed by a memory controller device, such as the memory controller device 102 of FIG. 1.

The method begins at 402, by determining that a particular event has occurred. At 404, a determination may be made as to whether the particular event is one of a pre-specified set of events (e.g., link retraining completed, configuration completed during initialization, command received that is destined for a memory that is in a low power mode).

When the determination is "no," i.e., the particular event is not one of the pre-specified set of events, the method may return to 402. When the determination is alternatively "yes," i.e., the particular event is one of a pre-specified set of events, overlapping refreshes of one or more DRAM modules are enabled, at 406. For example, when the memory controller device 102 of FIG. 1 determines that the link retraining 144 is completed, the memory controller device 102 may enable overlapping refreshes of one or more of the DRAMs 115-118.

Advancing to 408, at least two overlapping refreshes of the one or more DRAM modules may be initiated. At 410, the overlapping refreshes of the one or more DRAM modules may be disabled after completing the at least two overlapping refreshes. For example, the memory controller device 102 of FIG. 1 may initiate at least two overlapping refreshes of one or more of the DRAM modules 115-118 and may disable overlapping refreshes after the at least two overlapping refreshes of the DRAM modules 115-118 has completed.

Thus, a memory controller device may initiate overlapping refreshes of DRAM during different situations, such as after completing a link retraining process, during an initialization process, or after receiving a command destined for the DRAM when the DRAM is in a low power mode. By doing so, the memory control device can issue at least one refresh command to the DRAM after the DRAM exits from a self-refresh mode.

Figure 5:
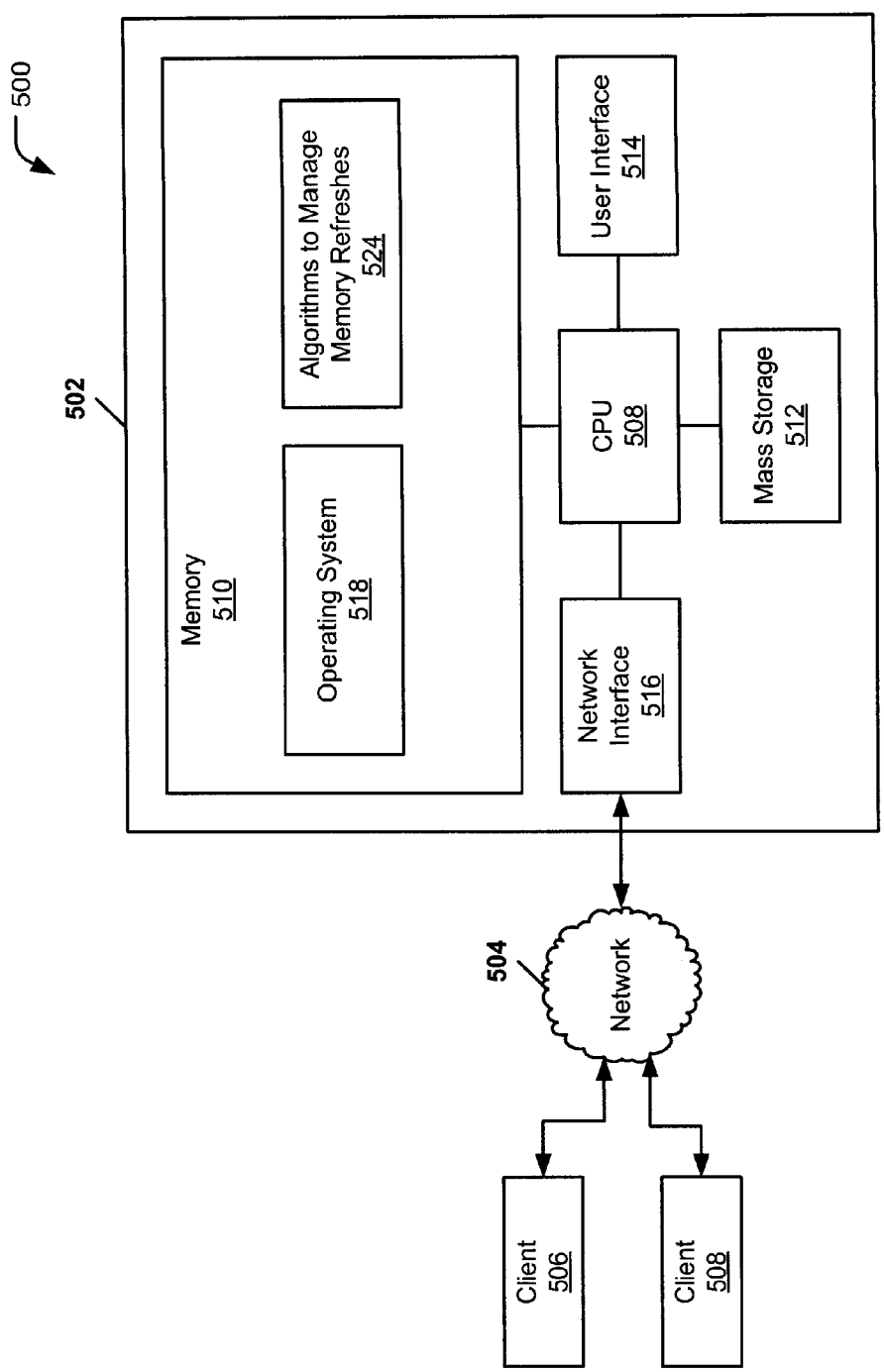
FIG. 5 a block diagram of a computer system configured to facilitate the development of an algorithm to manage memory refreshes.

FIG. 5 is a block diagram of a computer system configured to facilitate the development of an algorithm to manage memory refreshes and is generally designated 500. The system 500 illustrates an exemplary apparatus, within which algorithms to manage memory refreshes may be collaboratively developed in accordance with the underlying principles of the present disclosure.

A computer 502 may be implemented as a server or multi-user computer system that is coupled via a network 504 to one or more client computers 506 and 508. For the purposes of the illustrated embodiment, each of the computers 502, 506, and 508 may represent any type of computer, computer system or other programmable electronic device. Moreover, each of the computers 502, 506, and 508 may be implemented using one or more networked computers, e.g., in a cluster or other distributed computing system. In the alternative, applications may be implemented within a single computer or other programmable electronic device, such as a desktop computer, a laptop computer, a handheld computer, a cell phone, a set top box, a non-networked, standalone configuration, etc.

The computer 502 typically comprises a central processing unit (CPU) 508 that includes at least one microprocessor coupled to a memory 510. The memory 510 may represent random access memory (RAM) devices comprising a main storage device of the computer 502, as well as any supplemental levels of memory, such as cache memories, non-volatile or backup memories (programmable or flash memories), read-only memories, another type of memory, or any combination thereof. In addition, the memory 510 may be considered to include memory storage physically located elsewhere in the computer 502, e.g., any cache memory in a processor in CPU 508, as well as any storage capacity used as a virtual memory, as stored on a mass storage device 512 or on another computer coupled to the computer 502.

The computer 502 may receive a number of inputs and outputs for communicating information externally. For interface with a user or operator, the computer 502 may include a user interface 514 incorporating one or more user input devices (e.g., a keyboard, a mouse, a trackball, a joystick, a touchpad, and/or a microphone, etc.) and a display (e.g., a CRT monitor, an LCD display panel, and/or a speaker, etc.). User input may also be received via another computer or terminal.

For additional storage, the computer 502 may also include one or more mass storage devices 512, such as a floppy or other removable disk drive, a hard disk drive, a direct access storage device (DASD), an optical drive (a CD drive, a DVD drive, etc.), and/or a tape drive, among others. Furthermore, the computer 512 may include a network interface 516 with one or more networks 504 (e.g., a LAN, a WAN, a wireless network, and/or the Internet, and so on) to permit the communication of information with other computers and electronic devices. It should be appreciated that the computer 502 may include suitable analog and/or digital interfaces between CPU 508 and each of components 510, 512, 514, and 516 as is well known in the art.

The computer 502 operates under the control of an operating system 518 and executes or otherwise relies upon various computer software applications, components, programs, objects, modules, data structures, etc., as will be described in greater detail below. Moreover, various applications, components, programs, objects, modules, etc. may also execute on one or more processors in another computer coupled to the computer 502 via the network 504, e.g., in a distributed or client-server computing environment, whereby the processing required to implement the functions of a computer program may be allocated to multiple computers over a network.

As shown in FIG. 5, the memory 510 may also include algorithms to manage memory refreshes 524. The algorithms to manage memory refreshes 524 may be implemented in memory controller logic, such as in the logic 114 of the memory controller device 102 of FIG. 1.

In general, the routines executed to implement the embodiments of the invention, whether implemented as part of an operating system or a specific application, component, program, object, module or sequence of instructions, or even a subset thereof, will be referred to herein as "algorithms," "program code," or simply "programs." Program code typically comprises one or more instructions that are resident at various times in various memory and storage devices in a computer. When read and executed by one or more processors in a computer, the instructions cause that computer to perform the steps necessary to execute steps or elements embodying the various aspects of embodiments of the invention.

While embodiments of the invention have been described in the context of fully functioning computers and computer systems, those skilled in the art will appreciate that the various embodiments of the invention are capable of being distributed as a program product in a variety of forms, and that embodiments of the invention apply equally regardless of the particular type of computer readable media used to actually carry out the distribution. Examples of computer readable media comprise, but are not limited to tangible, recordable type media and transmission type media. Examples of tangible, recordable type media include volatile and non-volatile memory devices, floppy and other removable disks, hard disk drives, magnetic tape, and optical disks (CD-ROMs, DVDs, etc.). Examples of transmission type media include digital and analog communication links.

In addition, various program code described herein may be identified based upon the application within which it is implemented in a specific embodiment of the invention. However, it should be appreciated that any particular program nomenclature is used merely for convenience, and thus embodiments of the invention should not be limited to use solely in any specific application identified and/or implied by such nomenclature.

Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that embodiments of the invention are not limited to the specific organization and allocation of program functionality described herein.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

What is claimed is:

1. A method of managing memory refreshes, the method comprising:
for a plurality of dynamic random access memory modules, a plurality of memory redrive devices coupled to the plurality of dynamic random access memory modules via one or more memory buses, and a memory controller device having a plurality of memory controller ports coupled to the plurality of memory redrive devices via one or more high speed buses, determining, at the memory controller device, that a number of transmission errors between a particular memory controller port and a particular memory redrive device exceeds an error threshold;
in response to determining that the number of the transmission errors between the particular memory controller port and the particular memory redrive device exceeds the error threshold, initiating a first link retraining process between the particular memory controller port and the particular memory redrive device;
placing in a self-refresh mode at least one dynamic random access memory module of the plurality of dynamic random access memory modules that is coupled with the particular memory redrive device as part of the link retraining process;
removing the at least one dynamic random access memory module of the plurality of dynamic random access memory modules that is coupled to the particular memory redrive device from the self-refresh mode after the first link retraining process has completed; and
enabling overlapping refreshes of one or more dynamic random access memory modules of the plurality of dynamic random access memory modules.

2. The method of claim 1, further comprising initiating at least two overlapping refreshes of the one or more dynamic random access memory modules of the plurality of dynamic random access memory modules.

3. The method of claim 2, further comprising disabling the overlapping refreshes of the dynamic random access memory modules after completing the at least two overlapping refreshes of the one or more dynamic random access memory modules of the plurality of dynamic random access memory modules.

4. The method of claim 3, further comprising initiating a second link retraining process between the particular memory controller port and the particular memory redrive device.

5. The method of claim 1, further comprising detecting the transmission errors between the particular memory controller port and the particular memory redrive device before determining that the number of the transmission errors exceeds the error threshold.

6. The method of claim 1, wherein the transmission errors comprise cyclical redundancy check (CRC) errors.

7. The method of claim 1, wherein the number of the transmission errors includes a first number of transmission errors associated with a transfer between the particular memory controller port and the particular memory redrive device and includes a second number of transmission errors associated with two previous transfers between the particular memory controller port and the particular memory redrive device.

8. The method of claim 1, wherein the particular memory controller port is coupled to the particular memory redrive device via at least one of a Serial Management Interface (SMI) bus, a Fully Buffered Dual Inline Memory Module (FB-DIMM) bus, or a Fully Buffered Dual inline memory module 2 (FBD2) bus.

9. A system, comprising:
a plurality of dynamic random access memory modules;
a plurality of memory redrive devices coupled to the plurality of dynamic random access memory modules via one or more memory buses; and
a memory controller device having a plurality of memory controller ports coupled to the plurality of memory redrive devices via one or more high speed buses, the memory controller device to execute logic to:
determine that a number of transmission errors occurring in a particular pair of high speed buses exceeds an error threshold,
in response to deteimining that the number of the transmission errors in the particular pair of the high speed buses exceeds the error threshold, initiate a link retraining process between an affected memory controller port coupled to an affected memory redrive device associated with the particular pair of high speed buses via the particular pair of the high speed buses, place at least one dynamic random access memory module of the plurality of dynamic random access memory modules that is coupled with the affected memory redrive device in a self-refresh mode as part of the link retraining process, remove the at least one dynamic random access memory module of the plurality of dynamic random access memory modules that is coupled with the affected memory redrive device from the self-refresh mode after the link retraining process has completed, and initiate overlapping refreshes of one or more dynamic random access memory modules of the plurality of dynamic random access memory modules.

10. The system of claim 9, wherein at least one high speed bus of the particular pair of the high speed buses is at least one of a Serial Management Interface (SMI) bus, a Fully Buffered Dual Inline Memory Module (FB-DIMM) bus, or a Fully Buffered Dual inline memory module 2 (FBD2) bus.

11. The system of claim 9, wherein the memory controller device further executes logic to disable overlapping refreshes of the dynamic random access memory modules.

12. The system of claim 9, wherein the memory controller device further executes logic to initiate a second link retraining process between the affected memory controller port and the affected memory redrive device.

13. The system of claim 9, wherein the transmission errors comprise cyclical redundancy check (CRC) errors.

14. A computer program product comprising a non-transitory computer usable medium having computer usable program code embodied therewith, the computer usable program code executable by a processor to:

determine that a particular event occurred at a computer, wherein the computer includes a plurality of dynamic random access memory modules, a plurality of memory redrive devices coupled to the plurality of dynamic random access memory modules via one or more memory buses, and a memory controller device having a plurality of memory controller ports coupled to the plurality of memory redrive devices via one or more high speed buses;

enable overlapping refreshes of one or more dynamic random access memory modules of the plurality of dynamic random access memory modules in response to determining that the particular event occurred at the computer;

initiate at least two overlapping refreshes of the one or more dynamic random access memory modules of the plurality of dynamic random access memory modules; and disable the overlapping refreshes of the one or more dynamic random access memory modules of the plurality of dynamic random access memory modules after the at least two overlapping refreshes has completed.

15. The computer program product of claim 14, wherein the particular event comprises completion of a link retraining process between a particular memory controller port of the memory controller device and a particular memory redrive device associated with the one or more dynamic random access memory modules.

16. The computer program product of claim 14, wherein the particular event comprises completion of a configuration process associated with the processor.

17. The computer program product of claim 16, wherein the configuration process is executed as part of an initialization process associated with the processor.

18. The computer program product of claim 14, wherein the particular event comprises receiving a command destined for a dynamic random access memory module that is in a low power mode.

19. The computer program product of claim 14, wherein the computer usable program code is further executable by the processor to initiate a second link retraining process between the particular memory controller port and the particular memory redrive device.

20. The computer program product of claim 14, wherein the transmission errors comprise cyclical redundancy check (CRC) errors.

* * * * *